United States Patent [19]

Kinoshita et al.

[11] Patent Number: 4,733,406
[45] Date of Patent: Mar. 22, 1988

[54] IMAGE SENSING CHARGE COUPLED DEVICE

[75] Inventors: Takao Kinoshita, Tokyo; Nobuyoshi Tanaka, Yokohama, both of Japan

[73] Assignee: Canon Kabushiki Kaisha, Tokyo, Japan

[21] Appl. No.: 738,549

[22] Filed: May 28, 1985

Related U.S. Application Data

[63] Continuation of Ser. No. 389,920, Jun. 18, 1982, abandoned.

[30] Foreign Application Priority Data

Sep. 17, 1981 [JP] Japan .................. 56-146588

[51] Int. Cl.⁴ .............. G11C 19/28; H01L 29/78; H01L 27/14; H01L 31/00
[52] U.S. Cl. ...................... 377/61; 377/58; 357/24; 357/30; 365/183
[58] Field of Search ............. 357/24 LR, 30; 377/57-63; 365/183

[56] References Cited

U.S. PATENT DOCUMENTS

| | | | |
|---|---|---|---|
| 3,876,952 | 4/1975 | Weimer | 357/24 LR |
| 3,896,474 | 7/1975 | Amelio et al. | 357/24 LR |
| 4,016,550 | 4/1977 | Weimer | 357/24 LR |
| 4,229,752 | 10/1980 | Hynecek | 357/24 |
| 4,245,164 | 1/1981 | Funahashi | 357/24 LR |
| 4,389,661 | 6/1983 | Yamada | 357/24 LR |

FOREIGN PATENT DOCUMENTS

| | | |
|---|---|---|
| 1413092 | 11/1975 | United Kingdom . |
| 1484275 | 9/1977 | United Kingdom . |
| 1501018 | 2/1978 | United Kingdom . |
| 2007937 | 5/1979 | United Kingdom . |
| 1579032 | 11/1980 | United Kingdom . |
| 2087152 | 5/1982 | United Kingdom . |

OTHER PUBLICATIONS

T. Tsukamoto, Fundamental of CCD and Application Thereof, *Electronics* (Japan), Apr. 1977, p. 365 at pp. 368-369.

*Primary Examiner*—Gene M. Munson
*Attorney, Agent, or Firm*—Fitzpatrick, Cella, Harper & Scinto

[57] ABSTRACT

In order to clear at a high speed unwanted charge in a solid image sensing element of a charge transfer type, a potential barrier for allowing passage of excessive charge in the direction of the transfer of a CCD shift register, is provided. Also, in order to clear the charge of the CCD shift register via the barrier, an overflow drain is provided. Thus, the clearing action is effected at a high speed, and also, a blooming can be eliminated.

17 Claims, 14 Drawing Figures

(a)

(b)

(a)

(b)

(a)

(b)

much time, and what is more, several clearing operations are needed to sufficiently clear a saturated CCD.
IMAGE SENSING CHARGE COUPLED DEVICE This application is a continuation of application Ser. No. 389,920, filed June 18, 1982 and now abandoned.

BACKGROUND OF THE INVENTION

1. Field of the Invention

The present invention relates to an image sensing device using a charge transfer type image sensing element, and provides an image sensing device which can discharge unwanted charge at a high speed.

2. Description of the Prior Art

Conventionally, a two-dimensional CCD (Charge Coupled Device) of frame transfer and interline type for obtaining image signals, and a one dimensional image sensing element used for a sensor device, have the drawback that, prior to starting to storing an image, the photoelectrons and thermoelectrons which have been stored before must be cleared, since otherwise those unwanted electrons result in noise lowering the S/N ratio.

In order to eliminate this drawback, it has been proposed that a switching element be provided for each of the picture elements of the image sensing element, and the switching elements all be actuated to discharge the charge stored in the picture elements to a power source. However, such as arrangement having the switching elements for respective picture elements image sensing elements leads to an increase in the number of the circuit elements, making the IC structure difficult. Further, the IC chip area and cost of manufacture increase, too. Moreover, the provision of such a switching element in the vicinity of the picture element necessarily reduces the area which can be occupied by the picture elements, thus decreasing the sensitivity of the image sensing device as a whole.

Therefore, in the conventional machines, the clearing operation is effected by reading out the charge information by a usual scanning process immediately before the start of the storing operation. However, this requires much time, and what is more, several clearing operations are needed to sufficiently clear a saturated CCD. Therefore, when the image sensing device is triggered, the scanning is first effected for a one frame picture to clear the charge, and then the storing for a new image is started. If the object to be sensed is moving at a relatively high speed, no desirable image can be provided because of the gap between the triggering and the start of image sensing. If the object has a high brightness, the storing time must be reduced correspondingly, since otherwise the charge in the image sensing element is saturated. In this case, if the storing time for the new image is shorter than the clearing time, the dark current and photoelectrons generated during the clearing time greatly affect the S/N ratio.

SUMMARY OF THE INVENTION

The principal object of the present invention is to provide an image sensing element and an image sensing device wherein the unwanted charge can be cleared quickly.

Another object of the present invention is to provide an image sensing element and an image sensing device which can be provided by adding a simple modification to the conventional image sensing element, and which can clear the unwanted charge.

Another object of the present invention is to provide an image sensing element and an image sensing device wherein a blooming phenomenon can be prevented by a simple structure.

Yet another object of the present invention is to provide an image sensing element and an image sensing device wherein the structure for the high speed charge clear functions also as means for preventing blooming.

According to an embodiment of the present invention, in order to achieve the above described object, an overflow drain is provided in the direction of a row of the transfer register of the image sensing element, and an anti-blooming barrier is provided between the overflow drain and the register so as to allow the excess charge within the register to discharge it.

According to another embodiment of the present invention, the image sensing device wherein the charge information from cells can be transferred to the respective bits of the transfer register, has an overflow drain connected to each of the bits of the transfer register via an anti-blooming barrier, so that simply by additionally inputting the charge information of the cells to the respective bits of said transfer register, the charge information can be discharged without blooming.

Other objects of the present invention will be made clear from the following description of the embodiments of the present invention in conjunction with the accompanying drawings.

DESCRIPTION OF THE PREFERRED EMBODIMENTS

Figure 1:
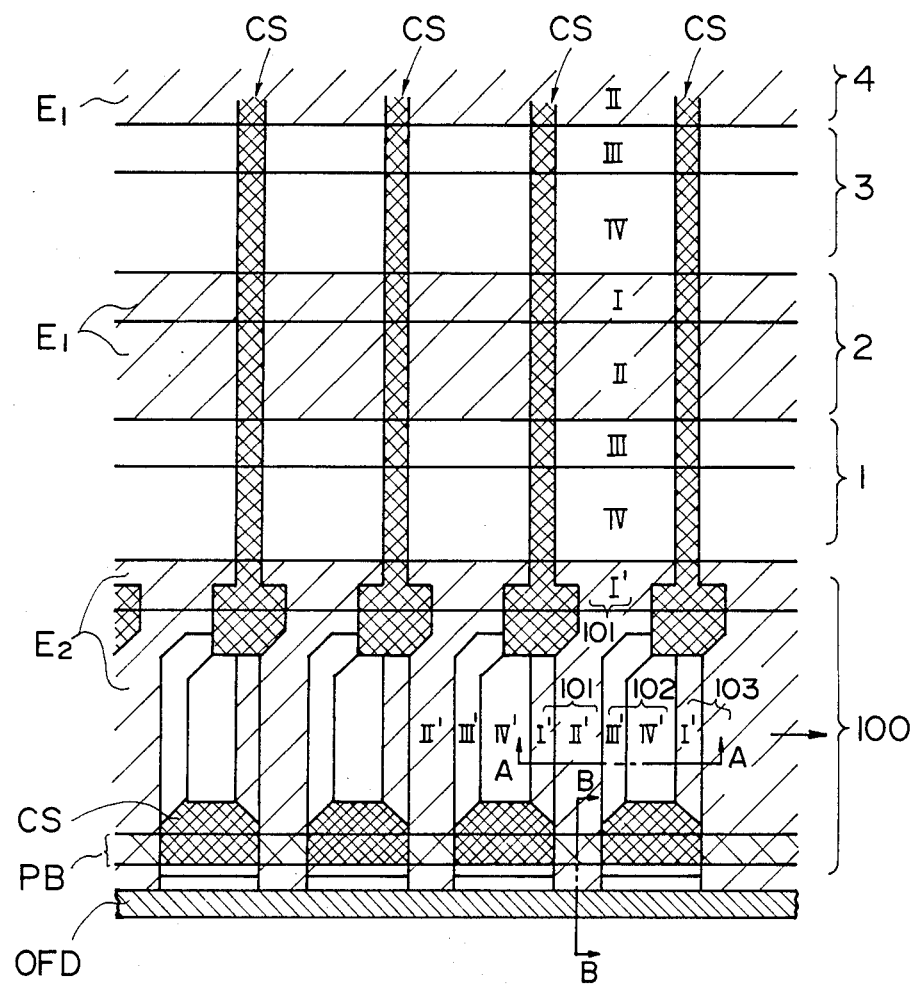
FIG. 1 shows an IC electrode pattern of a first embodiment of the image sensing device of the present invention.

FIG. 1 shows a first embodiment, of the present invention, of the image sensing element.

FIG. 1 only shows, for the sake of simplicity, a part of a horizontal shift register and the storing region 3, 3' . . . of a single phase driving CCD of a frame transfer type.

The horizontal shift register and the clearing structure of the present invention may be provided between the photo-receptor portion of the frame transfer type CCD and the storing portion, or may be connected to a vertical shift register of an interline transfer type CCD. Also, it is usable with such a type as a CPD (Charge Priming Device) wherein the vertical reading is effected by a MOS switch structure while the horizontal reading is effected by CCD. Of course, the invention is applicable to the CCD sensor array arranged in a line, and a linear sensor wherein the outputs of the photoreceptors arranged in a line is read out by CCD.

The feature of the first embodiment is in the provision of a low potential barrier PB (anti-blooming barrier) for removal of the excess charge, and the provision of the drain electrode 11, the barrier PB being located in the vicinity of the horizontal register and the drain electrode 11 being located in the vicinity of the barrier.

As for the transfer method, there have conventionally been a single phase drive type, a two phase drive type, a three phase drive type and four phase drive type and so on. The present invention is usable with any of them. However, for the sake of simplicity, the structure of a horizontal transfer register or a single phase type is explained herein. As for a single phase driving type, the device disclosed in U.S. Pat. No. 4,229,752 is known, for example, and there are other various type. Since, however, the present invention does not depend on the types of the charge transfer, detailed description has been omitted in this respect, for the sake of simplicity.

A channel stopper CS is provided to prevent the horizontal leak between the adjacent cells.

In the Figure, the reference characters $E_1$ and $E_2$ (hatched) depict poly-silicon electrode, PB, a potential barrier as the discharging means of the present invention, and OFD, an overflow drain to which a high positive voltage is applied when the substrate is of P-type.

Figure 2:
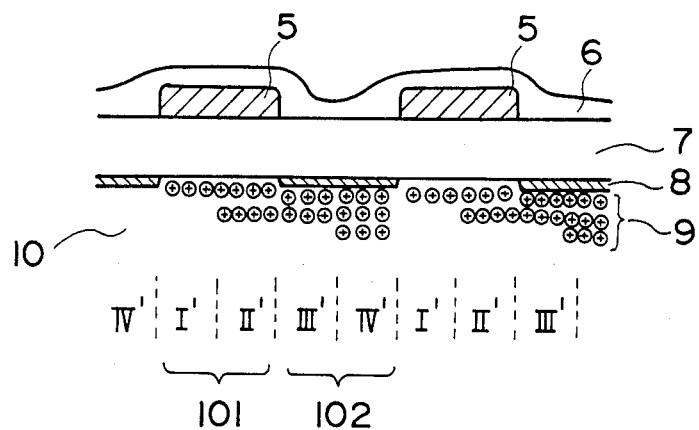
FIG. 2 shows a cross-section along A—A of FIG. 1.

Also, there are shown storing portions 1-4, and a shift register 100 which functions as reading means. As is well-known, signals can be input in parallel to each of the bits of the horizontal shift register, while the signals can be read out serially. The substrate has registers I, II, III, IV, I', II', III' and IV' having different potential levels, the regions being formed by ion injection, for example. The regions I, II are formed at a lower part of the electrode $E_1$ in the substrate, and the region I' and II' are formed at the lower part of the electrode $E_2$ in the substrate. The region III, IV, III' and IV' are formed at the lower part of a virtual electrode as shown in FIG. 2.

By the combination of the storing portions 1 and 2 or the storing portions 3 and 4, for example, the vertical cells are formed, and by the combination of the elements 101 and 102 a horizontal cell is formed.

When there is no bias applied to the electrode $E_1$ or $E_2$, the potential levels P(I)–P(IV) and P(I')–P(IV') of the regions I–IV and I'–IV' satisfy the following:

P(III) > P(IV) > P(I) > P(II)

P(I) = P(I'), P(II) = P(II'), P(III) = P(III'),
P(IV) = P(IV')

FIG. 2 shows A—A cross-section of the CCD shown in FIG. 1. In FIG. 2, there are shown an electrode of polysilicon, for example, protecting film 6 of $SiO_2$, for example, an insulating layer 7 of $SiO_2$, for example, a virtual electrode formed by implantation to a surface of a silicon substrate of a P-type, and impurity 9 of N-type formed by ionized and injected phosphorus or arsenic. When a relatively high level voltage is applied to the electrode 5 of such a structure, predetermined potential levels are formed in the regions I'–IV' as shown in solid lines in FIG. 4, and when a relatively low voltage is applied to the electrode 5, the potentials of the regions I' and II' change as shown in broken lines in the same Figure, while the potential levels in regions III' and IV' are constant since they are isolated from the voltage variations of the electrode 5 because of the existence of the virtual electrode 8.

Figure 3:
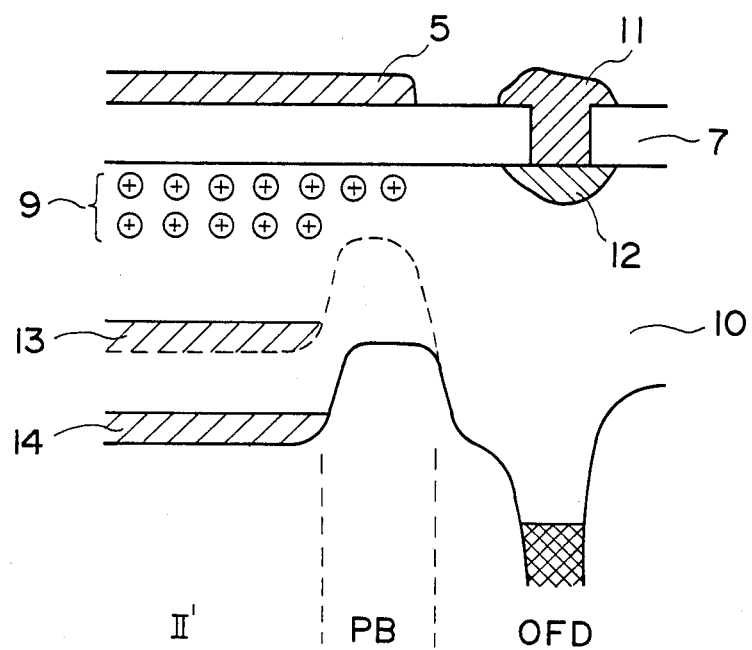
FIG. 3 shows a cross-section along B—B of FIG. 1.

FIG. 3 shows the B—B cross-section of the CCD shown in FIG. 1. The explanation of this Figure is simplified by using the same reference numerals for the means and elements having substantially the same functions. Reference numeral 11 designates an aluminum electrode, and 12 is an $n^+$ ion diffusing layer to which a high positive voltage is applied to form an overflow drain.

The potential barrier PB of the present invention, as shown in FIG. 3, is provided in the vicinity of the region II' by ion injection, for example. The potential level of the potential barrier is higher than the potential level of the region II', but lower than the potential level of the channel stopper. Since the potential barrier PB is located at the lower part of the electrode 5, the potential level thereof changes as shown in the Figure, in accordance with the voltage applied to the electrode 5, together with the potential level of the region II'. When a low level voltage is applied to the electrode 5, for example, the potential level becomes higher as shown by the broken lines 13, and on the contrary, when a relatively high level voltage is applied to the electrode 5, the potential level becomes lower as shown by the solid lines 14. The potentials are so set that when the potential of the electrode $E_2$ is relatively high, the potential of the potential barrier PB has a level which is lower than that of the region III' or the region IV'.

Figure 4:
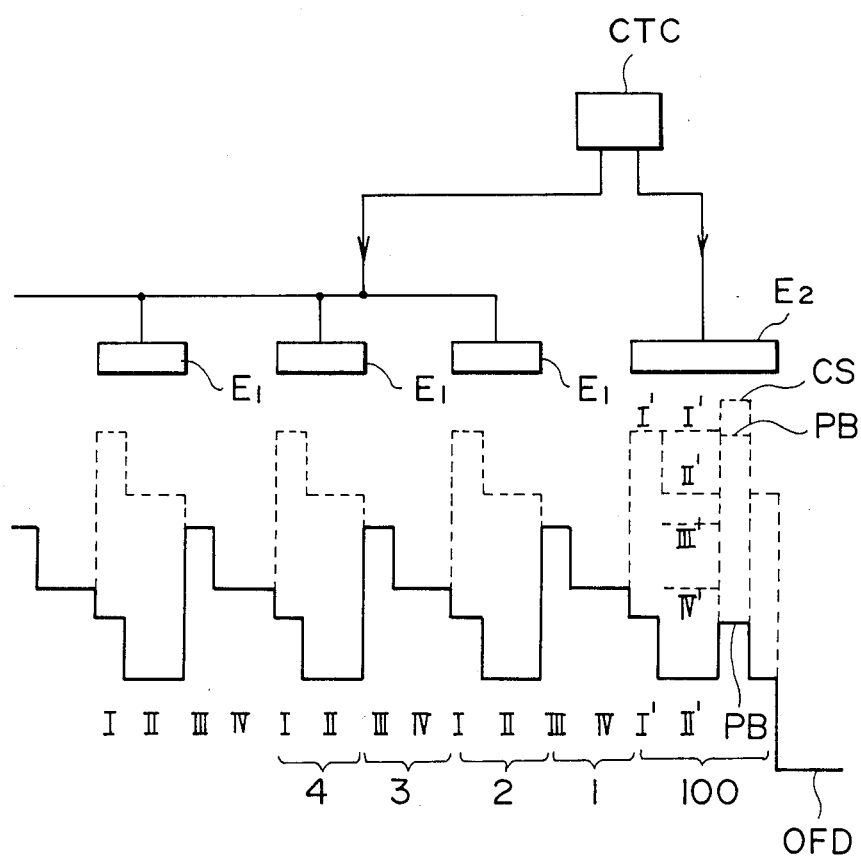
FIG. 4 shows a schematic diagram of the potential of the embodiment of FIG. 1.

FIG. 4 shows the potentials of the CCD of FIG. 1, schematically. The poly-silicon electrodes $E_1$ are commonly connected to the signal source c+c so as to receive a voltage for the charge transfer. The solid lines show the state when a relatively low level potential is applied to the poly-silicon electrodes $E_1$, and the broken lines show the potentials when a relatively high level potential is applied to the poly-silicon electrodes $E_1$.

The potential below the virtual electrode 8 of FIG. 2, as hereinbefore described, is slightly higher at the region III than at the region IV, as shown in FIG. 4 by reference numerals 3 and 1. The potential of this part is independent of the voltage applied to the electrode 32, and constant, so that by applying predetermined pulse voltages to the poly-silicon electrode, the charges are successively transferred in the manner which will be described hereinafter. The poly-silicon electrode $E_2$ of the horizontal shift register is applied with a voltage which is independent from the signal source CTC, via a signal pass which is different from that of the electrode $E_1$.

Figure 5:
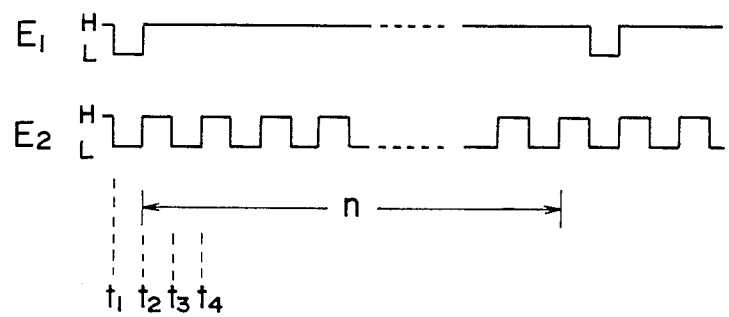
FIG. 5 shows a driving timing of the image sensing element of FIG. 1 by the signal source.
Figure 5:
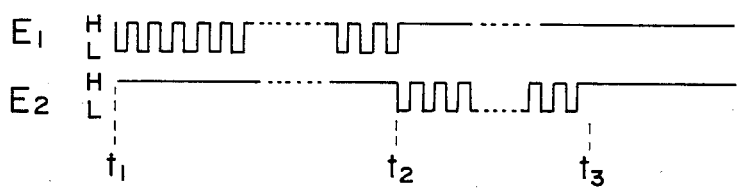

In FIG. 4, the potential of the channel stopper is shown by CS. FIG. 5 shows at (a) the timings at which the charge in the storing portion is read out one by one horizontal lines by the horizontal shift register in response to the signal source CTC. The movement of the charge in the horizontal shift register will now be described. The charge stored at the region II of the storing portion 2, for example, is transferred to the potential well region IV of the portion 1, upon the pulse voltage application to the poly-silicon electrode $E_1$ at the time $t_1$. Thereafter, when the potential level of the poly-silicon electrode $E_2$ of the horizontal transfer register becomes relatively high at the time $t_2$, the potential level in the regions I' and II' of the portion 101 becomes as shown in FIG. 4 by solid lines, and the charge in the region IV of the portion 101 is transferred to the region II' of the portion 1' of 101. At the time $t_3$, a relatively low level voltage is applied to the electrode 33, so that the potential at the regions I' and II' becomes higher than the potential level at the regions III' and IV' as shown by the broken lines in FIG. 4, with the result that the charge of the region 101 of the portion 101 is transferred to the region IV'. Subsequently, at the time $t_4$, the potential of the electrode $E_2$ becomes high again, so that the potential of the regions I' and II' of the portion 103 becomes lower than the potential of the regions III' and IV' of the portion 102, thus, the charge in the region IV' of the portion 102 is transferred to the region II' of the portion 103. The information in the storing portions can be scanned successively line by line, by applying a pulse to the electrode $E_1$, and simultaneously applying a pulse having the same phase to the electrode $E_2$, and then applying the number of pulses corresponding to the number of the bits of one horizontal line to the electrode $E_2$.

The start of the storing operation in response to an actuation of the power switch upon start of the storing action for new information, will now be described in conjunction with FIG. 5, (b) wherein the clearing action of the present invention is illustrated. At the time $t_1$, the power is turned on, so that the potential of the electrode $E_2$ of the horizontal register becomes high, and while the internal potential below the electrode becomes as shown by the solid line of FIG. 4, the pulses are applied to the electrode $E_1$ of the storing portion at a high speed, so that the charge is transferred at a high speed to the region II' of the horizontal register as described above. The excessive charge that has flowed into the region II' discharges to the chain OFD via the potential barrier PB. The unwanted charge which has not been removed and remains in the region II', is quickly removed during the period between time $t_2$ and time $t_3$, by the transfer of the horizontal register via an ouptut amplifier 17. The potential of the anti-blooming barrier PB varies with the potential of the region II' by the horizontal transfer pulse, as shown in FIG. 4, and it is at all times higher than the potential level of the region II', so that, upon the signal transfer to the outside by the horizontal register, it is not possible for the signal charge to flow beyond the barrier PB, so that the external transfer is ensured at all times.

Figure 6:
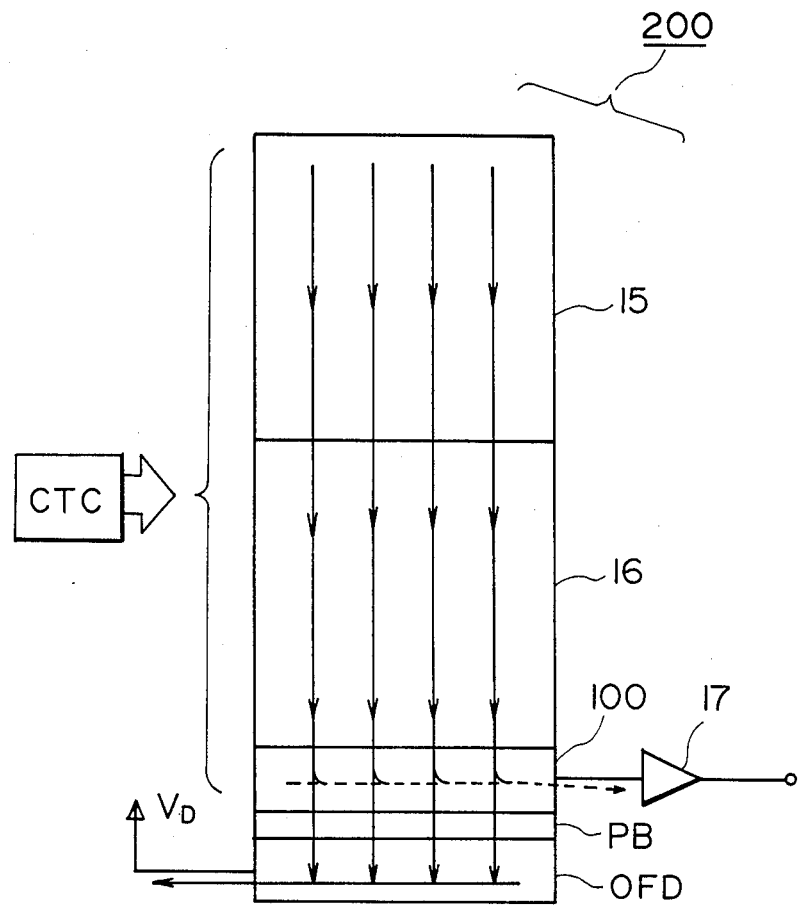
FIG. 6 shows the movement of the charge in the device of FIG. 1.
Figure 7:
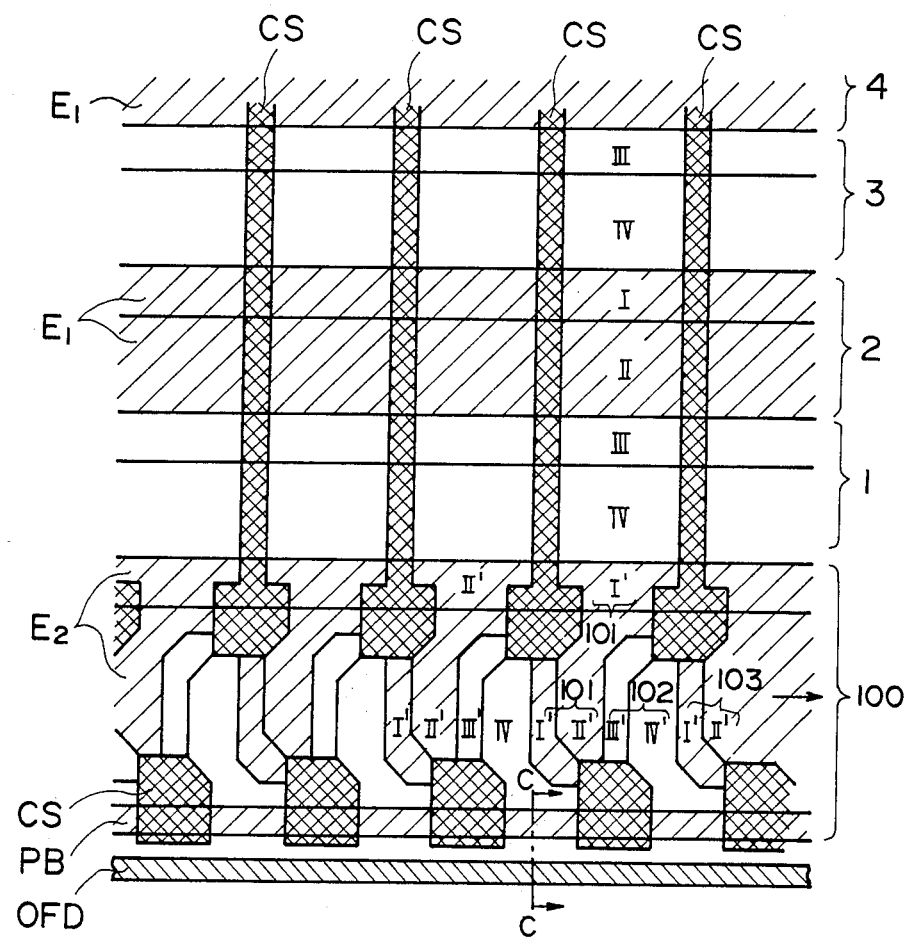
FIG. 7 shows an IC electrode pattern of a second embodiment of the image sensing device of the present invention.
Figure 8:
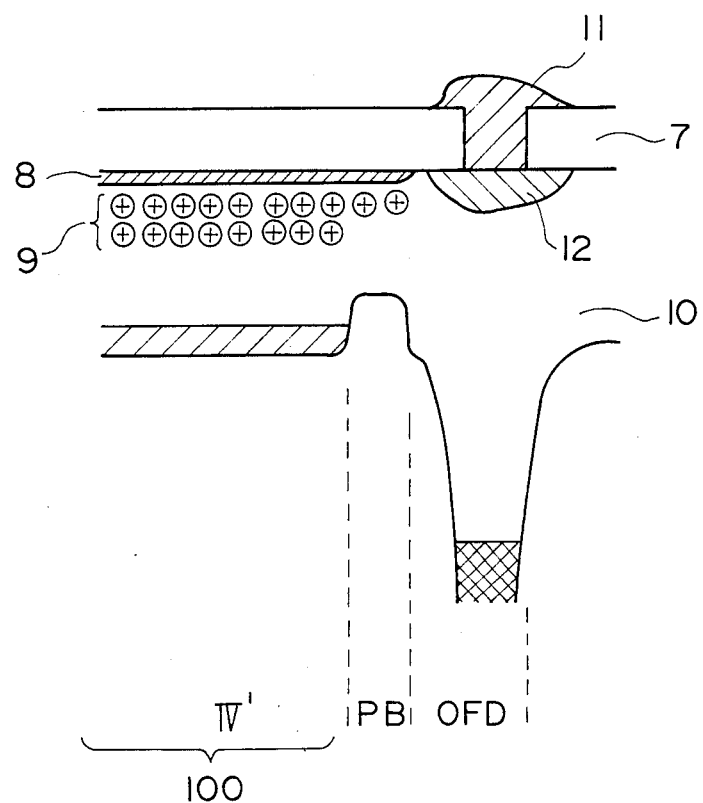
FIG. 8 shows a cross-section along C—C of FIG. 2.
Figure 9:
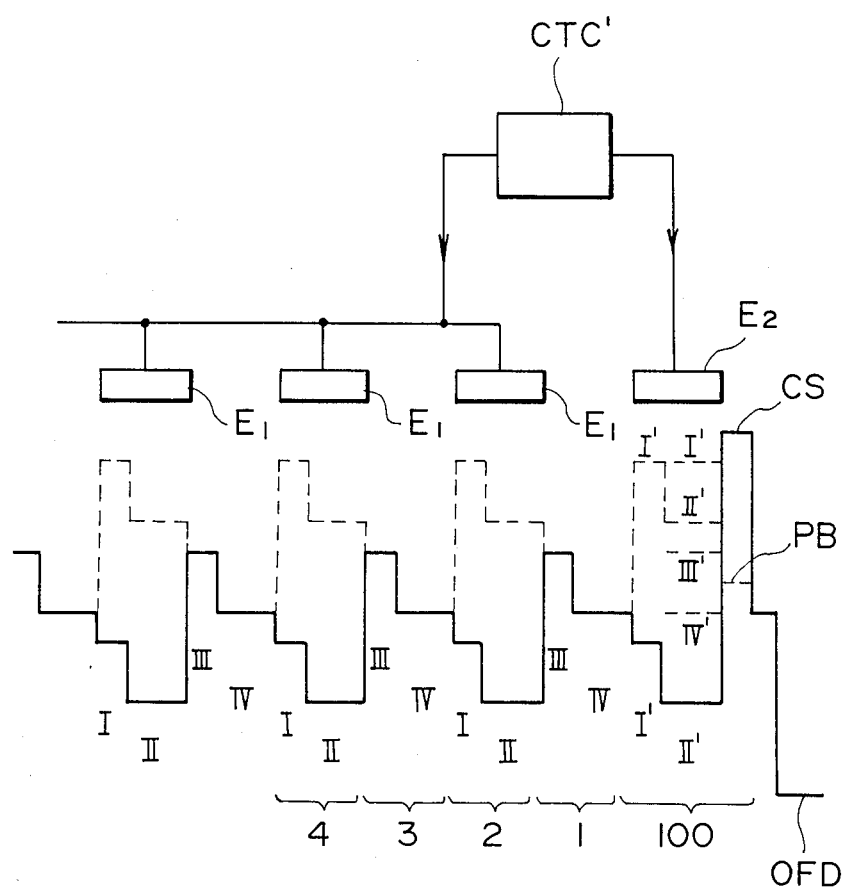
FIG. 9 shows a schematic diagram of the potential of the embodiment of FIG. 2.

FIG. 6 schematically shows the charge removal action in the first embodiment, wherein reference numeral 200 depicts a frame transfer type CCD, 15, a photoreceptor portion, and 16, a storing portion isolated from light. There is provided an output amplifier for amplifying the read-out signal from the horizontal register (reading means) and converting it to a voltage signal. As shown in the Figure, the charge at the various portions of the CCD flows into the overflow drain OFD, and thus is removed, via the potential barrier PB by applying simultaneously a predetermined control signal to the photo-receptor portion 15, the storing portion 16 and the horizontal shift register 100 from the driving signal source CTC. Thereafter, the charge remaining in the register 100 is discharged by the reading action of the register for one line.

FIGS. 7-10 show a second embodiment, which is basically similar to the first embodiment, but the potential barrier as the anti-blooming barrier is made free from the influence of the voltage change of the electrode $E_2$ by the virtual electrode, and it is located in the vicinity of the region IV' of the horizontal register. The potential level of the potential barrier PB is between the potential levels of the regions III' and IV'. In FIGS. 7-10, the elements having the same reference numerals as shown in FIGS. 1-6 have the same functions. The operation of the image sensing device of the second embodiment will be described in conjunction with FIGS. 10, (a) and (b). In the usual reading action by a horizontal register, the storing portion is not driven, but only the horizontal register portions are driven after the time $t_1$. By so setting the barrier that the charge of a proper amount does not go beyond the barrier, only the horizontal transfer is effected as described hereinbefore, so that usual proper reading of the signal is executed.

Upon a high speed clearing action, the number of the pulses required for scanning the entire storing portion in the time between time $t_1$ to $t_2$ are applied to the electrode $E_1$, and the pulses of the same frequency and the same phase are applied to the electrode $E_2$, thus effecting the high speed clearing action.

Figure 10:
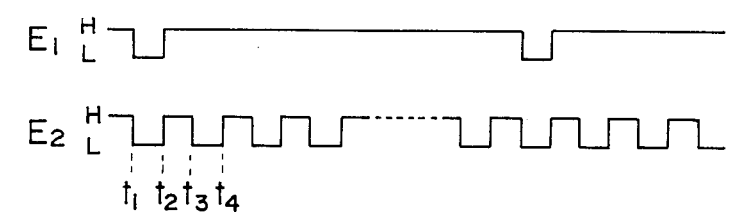
FIG. 10 shows a driving timing of the image sensing element of FIG. 2 by the signal source.
Figure 10:
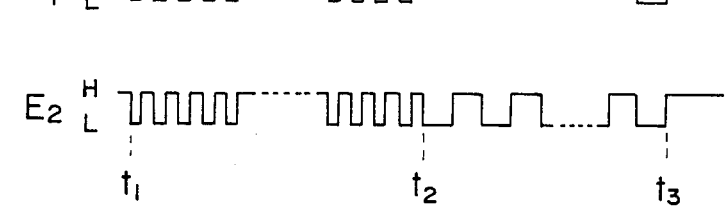
Figure 11:
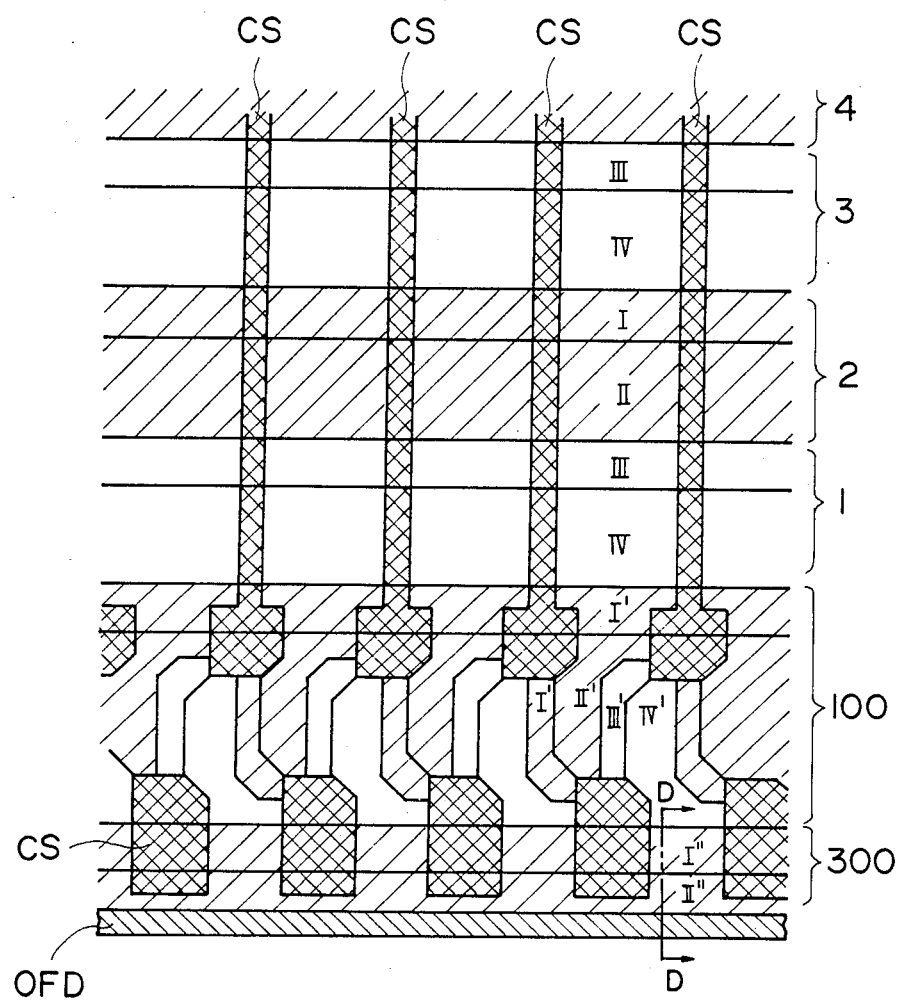
FIG. 11 shows an IC electrode pattern of a third embodiment of the image sensing device of the present invention.
Figure 12:
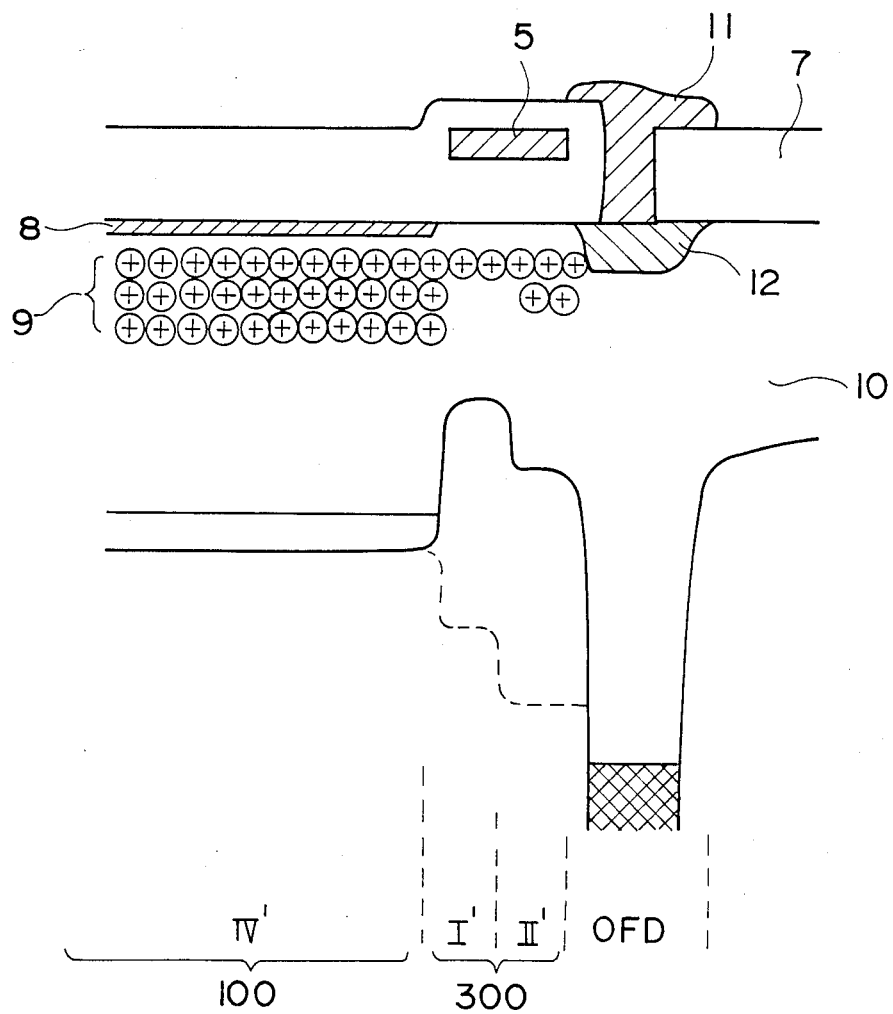
FIG. 12 shows a cross-section along D—D of FIG. 11.

At the time $t_1$ (FIG. 10, (b)), the storing portion is driven to successively transfer the stored charge of the storing portion to the region II' of the horizontal register, and the driving signal is also applied to the electrode $E_2$ to change the potential of the regions, I' and II' alternatively to the state shown by the solid lines and the state shown by the broken lines to successively inject the charge in the storing portion to region II' of the horizontal shift register, and also, the transferring action of the horizontal register is affected. On this occasion, the excessive charge, of the charge transferred to the region IV', which is beyond the potential barrier PB is overflows over the barrier to clear the excessive barrier. And, the charge still remaining is cleared by the scanning for a one line in the time between the time $t_2$ and the time $t_3$.

FIGS. 11-14 show a third embodiment of the present invention. In those Figures, the elements having the same reference numerals or characters as in FIGS. 1-10 have the same functions.

Figure 13:
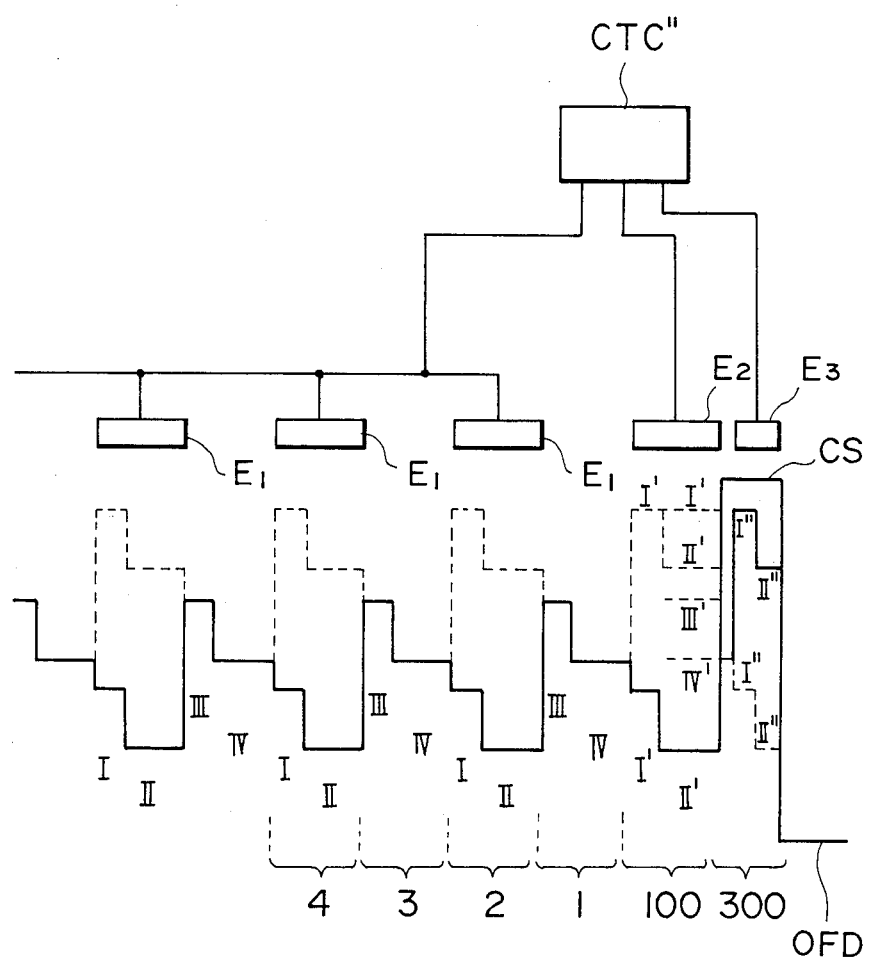
FIG. 13 shows a schematic diagram of the potential of the embodiment of FIG. 11.
Figure 14:
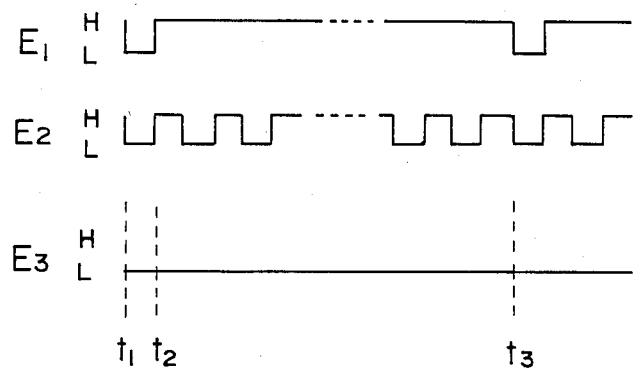
FIG. 14 shows a driving timing of the image sensing element of FIG. 11 by the signal source.
Figure 14:
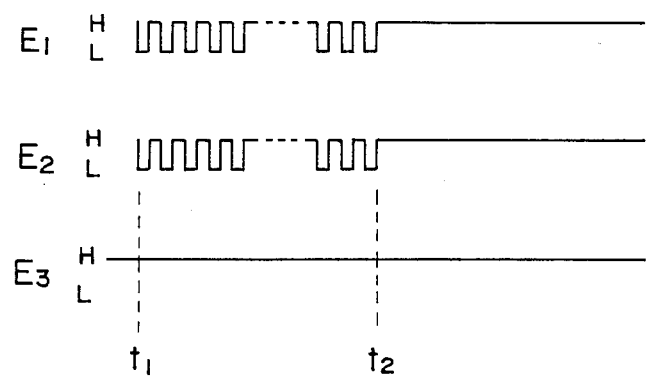

The feature of the third embodiment is in the clear gate 300 as the discharging means, in place of the anti-blooming barrier. The clear gate 300 has an electrode 300 of poly-silicon. In the substrate therebelow, there are formed regions I'' and II'' having different potential levels shown by solid lines when the potential of the electrode is relatively low. This can be formed by conventional processes, ion injection, for example. When a high level voltage is applied to the electrode $E_3$, the potential level becomes low as shown in FIG. 13, broken lines. Therefore, as shown in FIG. 14, (a), upon usual transferring action of the horizontal register, the gate 300 is closed, i.e., the potential of the regions I'' and II'' are made as shown by the solid lines to prevent the flowing-out of the signal charge. Under this conditions, the pulses are applied to the electrode $E_2$ of the horizontal register to carry out the reading-out.

Upon the high speed clearing, the gate 300 is opened as shown in FIG. 14, (b), that is, the potential of the regions I'' and III'' is changed to the state shown by the broken lines from the state shown by the solid lines, and as in the second embodiment, the storing portion and the horizontal register portion are driven by the pulses of the same frequency at the same phase to clear the excessive charge. In other words, as with the second embodiment, the charge is transferred successively from the storing portion to the region II' of the horizontal register, and the charge thus successively transferred to the region II' is transferred, in turn, to the region IV', and the charge successively transferred to the region IV' is overflows via the gate having the potential shown by the broken lines, thus clearing the charge.

As described above, by the provision of the drain electrode for the removal of the excessive charge adjacent the horizontal register via the low potential barrier (anti-blooming barrier), the high speed removal of the unwanted charge upon the start of the action (when power source rendered on or clock signal render on) is made possible so as to permit a quick start of the picture taking. Especially, the present invention is useful in a device, such as a still camera, which requires the high speed charge removal.

What is claimed is:

1. A charge-coupled device comprising:
   (A) storage means in a matrix of rows and columns for storing electrical charges, said storage means including a plurality of storage elements arranged in a matrix;
   (B) read-out means for receiving the electrical charges from said storage means and for reading out the electrical charge in said read-out means;
   (C) clear means for clearing charges, disposed adjacent to said read-out means,
      wherein said clear means is disposed along said read-out means and is arranged to clear charges from said read-out means;
      said clear means comprising;
         (i) a first portion for extinguishing electrical charges;
         (ii) a second portion disposed between said read-out means and said first portion, said second portion being arranged for introducing the charges into said first portion from said read-out means; and
         (iii) electrode means common to said second portion in said clear means and a part of said read-out means for applying electrical signals to concurrently change the potential levels of said second portion and said part of said read-out means; and
   (D) control means for controlling at least said storage means and said read-out means in a first control mode and a second control mode, wherein, in the first control mode, the charges from said storage means are sequentially read out as an electrical signal by said read-out means in a relatively long period and, in the second control mode, almost all of the charges from said storage means are sequentially introduced into said clear means through said read-out means to be cleared in a relatively short period.

2. The device according to claim 1, wherein said read-out means includes an electrode for receiving the charge from said storage means, the electrode constituting part of said electrode means.

3. The device according to claim 2, wherein said electrode means to transfer the charges in said read-out means in a row direction.

4. An image sensing device comprising:
   image sensing means including a plurality of opto-electronic elements for converting an optical image into electrical signals, said optoelectronic elements being arranged in a matrix;
   storage means for storing the electrical signals from said plurality of optoelectronic elements;
   read-out means for receiving the signals from said storage means and for reading out the signals received from said storage means in a predetermined period;
   clear means for clearing charges, disposed along said read-out means and including a drain for absorbing charges and barrier means for forming a predetermined potential level between said drain and said read-out means;
   a common electrode for commonly controlling the potential level of said barrier means and the potential level of part of said read-out means; and
   control means having at least a control mode where at least said storage means and said common electrode are driven so that almost all of the signals stored at least at said storage means are guided to said clear means through said storage means and said read-out means in a relatively short period which is shorter than said predetermined period.

5. The device according to claim 4, wherein said image sensing means comprises a plurality of charge-transfer registers arranged in a column direction.

6. The device according to claim 5, wherein said plurality of charge-transfer registers respectively have an opto-electronic conversion function.

7. The device according to claim 4, wherein said storage means comprises a plurality of charge-transfer registers arranged in a column direction.

8. The device according to claim 4, wherein said read-out means includes a shift register for sequentially reading out the row signals in said said storage means.

9. The device according to claim 8, wherein said read-out means is disposed at the opposite side of said storage means from said sensing means.

10. The device according to claim 4, wherein said clear means is disposed at the opposite side of said read-out means from said storage means.

11. The device according to claim 4, wherein said control means generates an overflow in said read-out means by adding the signals from said storage means to cause said clear means to conduct the clearing.

12. The device according to claim 4, wherein said read-out means includes a first channel for transferring the charges of said storage means into said read-out means and a second channel for shifting the charges of said read-out means in row direction.

13. The device according to claim 12, wherein the common electrode concurrently controls at least the potential level of the barrier means and the potential level of the first channel.

14. A charge clear system comprising:
   storage means for storing electrical charges, said storage means having a plurality of charge storage elements arranged in a matrix of rows and columns;
   read-out means for receiving the charges row by row from said storage means and for serially reading out, for each row, signals corresponding to the charges received from said storage means;
   clear means for clearing charges, disposed along said read-out means and at the opposite side of said read-out means from said storage means, said clear means including a drain for absorbing charges and barrier means for forming a predetermined potential level between said drain and said read-out means; and control means having a control mode in which almost all rows of the electrical charges at least at said storage means are guided to said clear means through said read-out means to be cleared by said clear means.

15. The system according to claim 14, wherein said barrier means includes a control electrode for variably controlling the potential level of the barrier means.

16. The system according to claim 15, wherein said read-out means includes an electrode for receiving the charges from said storage means, the electrode and the control electrode being commonly connected.

17. The system according to claim 15, wherein said control electrode serves to change the potential level difference of the barrier means to said read-out means.

* * * * *

UNITED STATES PATENT AND TRADEMARK OFFICE
CERTIFICATE OF CORRECTION

PATENT NO. : 4,733,406  
DATED : March 22, 1988  
INVENTOR(S) : TAKAO KINOSHITA, ET AL.

It is certified that error appears in the above-identified patent and that said Letters Patent is hereby corrected as shown below:

COLUMN 1

Line 18, "storing" should read --store--.  
    Line 21, "noise" should read --noise,--.  
    Line 28, "as" should read --an--.  
    Line 53, "element" should read --elements--.

COLUMN 2

Line 41, "FIG. 1." should read --FIG. 1;--.  
    Line 45, "FIG. 2;" should read --FIG. 7;--.  
    Line 47, "FIG. 2;" should read --FIG. 7;--.  
    Line 49, "FIG. 2" should read --FIG. 7--.

COLUMN 3

Line 21, "or" should read --of--.  
    Line 24, "type." should read --types.--.  
    Line 43, "region" should read --regions--.  
    Line 45, "region" should read --regions--.

COLUMN 4

Line 39, "signal source C+C" should read --signal source CTC--.

COLUMN 6

Line 35, "affected" should read --effected--.  
    Line 38, "overflows" should read --overflown--.  
    Line 60, "this" should read --these--.

UNITED STATES PATENT AND TRADEMARK OFFICE
CERTIFICATE OF CORRECTION

PATENT NO. : 4,733,406

DATED : March 22, 1988

INVENTOR(S) : TAKAO KINOSHITA, ET AL.

It is certified that error appears in the above-identified patent and that said Letters Patent is hereby corrected as shown below:

COLUMN 7

Line 8, "overflows" should read --overflown--.
Line 15, "render" should read --rendered--.
Line 64, "means" should read --serves--.

COLUMN 8

Line 35, "said said" should read --said--.

Signed and Sealed this

Fourth Day of October, 1988

Attest:

DONALD J. QUIGG

Attesting Officer     Commissioner of Patents and Trademarks